US012757680B2

(12) United States Patent
Dodampegamage et al.

(10) Patent No.: US 12,757,680 B2
(45) Date of Patent: Oct. 6, 2026

(54) ARC CURRENT REDUCTION FROM AN ELECTROSTATIC CHUCK

(71) Applicant: Applied Materials, Inc., Santa Clara, CA (US)

(72) Inventors: Nuwan S. Dodampegamage, Santa Clara, CA (US); Bryan Liao, Sunnyvale, CA (US); Liliya I. Krivulina, Santa Clara, CA (US); Dmitry A. Dzilno, Sunnyvale, CA (US); Uwe P. Haller, San Jose, CA (US); Jian Li, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 131 days.

(21) Appl. No.: 18/596,262

(22) Filed: Mar. 5, 2024

(65) Prior Publication Data

US 2025/0285902 A1 Sep. 11, 2025

(51) Int. Cl.
*H10P 72/72* (2026.01)
*H01J 37/32* (2006.01)

(52) U.S. Cl.
CPC ...... *H10P 72/722* (2026.01); *H01J 37/32055* (2013.01); *H01J 37/32715* (2013.01); *H01J 37/32944* (2013.01); *H01J 37/3299* (2013.01); *H01J 2237/24564* (2013.01); *H01J 2237/24585* (2013.01); *H01J 2237/3321* (2013.01)

(58) Field of Classification Search
CPC ............ H01L 21/6833; H01J 37/32055; H01J 37/32715; H01J 37/32944; H01J 37/3299; H01J 2237/24585; H01J 2237/3321
USPC ............ 361/234
See application file for complete search history.

(56) References Cited

U.S. PATENT DOCUMENTS 5,886,865 A 3/1999 Parkhe et al.
11,315,819 B2 * 4/2022 Chen .................. H05B 3/0047
2004/0016405 A1 1/2004 Mays et al.
(Continued)

FOREIGN PATENT DOCUMENTS

TW 201120988 A 6/2011

OTHER PUBLICATIONS

International Application No. PCT/US2025/017279, International Search Report and Written Opinion mailed on Jun. 4, 2025, 12 pages.
(Continued)

*Primary Examiner* — Michael R. Fin
(74) *Attorney, Agent, or Firm* — Kilpatrick Townsend & Stockton LLP

(57) ABSTRACT

A semiconductor processing chamber may include an electrostatic chuck (ESC) with one or more electrodes that may deliver a chucking voltage to the pedestal. The pedestal can support a substrate while a semiconductor process occurs in the semiconductor processing chamber. The one or more electrodes may be coupled to an ESC power source that may provide the chucking voltage and may have an adjustable current limit. The adjustable current limit may be set based on certain characteristics of a semiconductor process that may be occurring in the semiconductor processing chamber. The ESC power source can prevent the supplied current from exceeding the adjustable current limit, thereby preventing current arcs from discharging into the substrate.

7 Claims, 6 Drawing Sheets

(56) References Cited

U.S. PATENT DOCUMENTS

| | | | | |
|---|---|---|---|---|
| 2004/0031699 | A1 * | 2/2004 | Shoji .................. | H01L 21/6833 205/791.5 |
| 2011/0140712 | A1 | 6/2011 | Inoue | |
| 2023/0130106 | A1 | 4/2023 | Adimadhyam et al. | |

OTHER PUBLICATIONS

Taiwanese Application No. 114107898, Office Action mailed on Oct. 16, 2025, 11 pages (1 page of English Translation and 10 pages of Original Documents).

* cited by examiner

ARC CURRENT REDUCTION FROM AN ELECTROSTATIC CHUCK

TECHNICAL FIELD

This disclosure generally describes methods and systems for electrostatic chucks. More specifically, this disclosure describes techniques for preventing arcing in electrostatic chucks.

BACKGROUND

Electrostatic chucks (ESCs) play a crucial role in semiconductor processing chambers, where precision and control are paramount. These devices are designed to securely hold delicate semiconductor wafers in place during various stages of the manufacturing process. Unlike traditional mechanical clamps, ESCs utilize the principles of electrostatic attraction to immobilize the wafer without any physical contact. For example, a voltage may be applied to the ESC that generates a charge buildup in the substrate support. This may cause an opposing charge buildup in the substrate itself, and the attractive force between these opposing charges holds the substrate to the support during the semiconductor process. This contactless grip minimizes the risk of damage to the wafer's surface, ensuring the integrity of the semiconductor material. By generating an electrostatic field between the chuck and the wafer, ESCs create a hold that prevents wafer movement and maintains a flat wafer profile. This precision is crucial in semiconductor manufacturing, where even minor misalignments can lead to defects and reduced yield. ESCs are equipped with electrodes that can be controlled to allow for fine-tuning of the electrostatic forces acting on different parts of the wafer.

SUMMARY

In some embodiments, a semiconductor processing chamber may include a pedestal that may support a substrate during a semiconductor process. The semiconductor processing chamber may include an electrostatic chuck (ESC) having one or more electrodes embedded in the pedestal. The electrodes may deliver a chucking voltage to the pedestal during the semiconductor process. The semiconductor processing chamber may also include an ESC power source that may be coupled to an electrode in the one or more electrodes and may provide the chucking voltage. The ESC power source may have an adjustable current limit that may depend on certain characteristics of the semiconductor process.

In some embodiments, a process for reducing arcing in an electrostatic chuck pedestal may involve causing a semiconductor process to be performed on a substrate supported by a pedestal in a semiconductor processing chamber. The pedestal may include one or more electrodes of an electrostatic chuck (ESC) embedded in the pedestal. The process may include determining a current of an ESC power source that prevents arcing or at which arcing does not occur between the one or more electrodes and the substrate during the semiconductor process. The process may also include setting an adjustable current limit of the ESC power source based on the current that prevents arcing or at which arcing does not occur. The process may further include causing the ESC power source to provide a chucking voltage to the one or more electrodes during the semiconductor process.

In some embodiments, a process for identifying an adjustable current limits for electrostatic chucks may include causing a semiconductor process to be performed on a substrate supported by a pedestal in a semiconductor processing chamber, where the pedestal may include one or more electrodes of an electrostatic chuck (ESC) embedded in the pedestal. The process may involve setting a chucking voltage of an ESC power source to a first voltage. The process may involve detecting whether a current arc occurred between the one or more electrodes and the substrate during the semiconductor process. The process may involve adjusting the current limit of the ESC power source based on whether a current arc occurred between the electrodes and the substrate during the semiconductor process.

In any embodiments, any and/or all of the following features may be implemented in any combination and without limitation. The adjustable current limit is set below a current level at which arcing between the one or more electrodes in the substrate occurs. The adjustable current limit may be an integrated function of the ESC power source. The characteristics of the semiconductor process may include a temperature at which the semiconductor process is performed. The characteristics of the semiconductor process may include a resistivity of the pedestal. The adjustable current limit may be automatically set by a controller. The chamber may also include a current monitoring circuit that is configured to monitor a current output of the ESC power source. The controller may be further configured to monitor the current monitoring circuit of the ESC power source and detect a current arc between the one or more electrodes and the substrate when the current output exceeds a threshold.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION

Semiconductor processes rely on properly holding a substrate against a pedestal using an electrostatic chuck. The electrostatic chuck may include one or more electrodes that may deliver a chucking voltage to the pedestal or substrate support. The chucking voltage may cause charge buildup on the electrodes of the electrostatic chuck in the pedestal in response. Generate a corresponding opposing charge buildup in the substrate itself, and these opposing charges may result in an attractive force that holds the substrate to the pedestal. However, this charge buildup may unintentionally also result in current arcs from the substrate. These current arcs may cause damage to the substrate, the electrostatic chuck pedestal, or subcomponents thereof (e.g., a heater element).

Certain aspects of the present disclosure may prevent current arcs from discharging into the substrate, the plasma, or other areas by implementing an adjustable current limit on a power source for the electrostatic chuck. For example, a semiconductor processing chamber may include an electrostatic chuck (ESC) with one or more electrodes that may deliver a chucking voltage to the pedestal. The one or more electrodes may be coupled to an ESC power source that may provide the chucking voltage and may have an adjustable current limit. The adjustable current limit may be set based on certain characteristics of a semiconductor process that may be present in the semiconductor processing chamber in the process. The ESC power source may prevent the supplied current from exceeding the adjustable current limit, thereby preventing current arcs from discharging into the substrate or damaging any subcomponents of the electrostatic chuck or pedestal.

After describing general aspects of a chamber according to some embodiments of the present technology in which plasma processing operations discussed below may be performed, specific methodology may be discussed. It is to be understood that the present technology is not intended to be limited to the specific films, chambers or processes discussed, as the techniques described may be used to improve a number of film formation processes, and may be applicable to a variety of processing chambers and operations.

Figure 1:
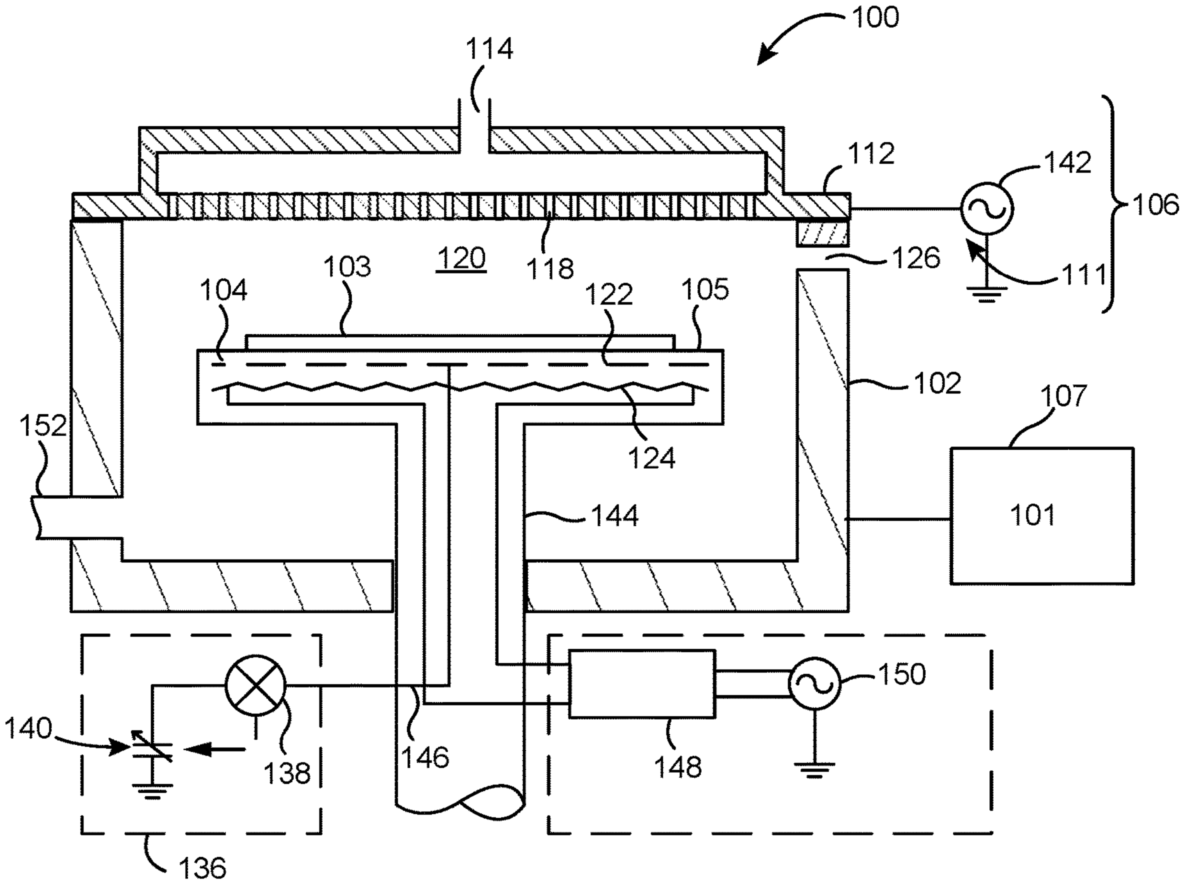
FIG. 1 shows a schematic cross-sectional view of an example of a processing chamber, according to some embodiments.

FIG. 1 shows a cross-sectional view of an example of a processing chamber 100, according to some embodiments. The figure may illustrate an overview of a system incorporating one or more aspects of the present technology, and/or which may be specifically configured to perform one or more operations according to embodiments of the present technology. Additional details of chamber 100 or methods performed may be described further below. Chamber 100 may be utilized to form film layers, etch material layers, form other material layers, or a combination thereof, although it is to be understood that deposition and etch methods may similarly be performed in any chamber within which deposition and etch processes may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. In some embodiments, the substrate support 104 may be rotatable, along a vertical axis, where a shaft 144 of the substrate support 104 may be located, or may be stationary. Alternatively, the substrate support 104 may be lifted up to rotate as necessary during a deposition process.

A gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

A first electrode 122 may be coupled with the substrate support 104. The first electrode 122 may be embedded within the substrate support 104 or coupled with a surface of the substrate support 104. The first electrode 122 may be a plate, a perforated plate, a mesh, a wire screen, or any other distributed arrangement of conductive elements. The first electrode 122 may be a tuning electrode and may be coupled with a tuning circuit 136 by a conduit 146, for example a cable having a selected resistance, such as 50 ohms, for example, disposed in the shaft 144 of the substrate support 104. The tuning circuit 136 may have an electronic sensor 138 and an electronic controller 140, which may be a variable capacitor. The electronic sensor 138 may be a voltage or current sensor and may be coupled with the electronic controller 140 to provide further control over plasma conditions in the processing volume 120.

A second electrode 124, which may be a bias electrode and/or an electrostatic chucking electrode, may be coupled with the substrate support 104. The second electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power. The substrate support 104 may also include one or more heating elements configured to heat the substrate to a processing temperature, which may be between about 25° C. and about 800° C. or greater.

The lid assembly 106 and substrate support 104 of FIG. 1 may be used with any processing chamber for plasma or thermal processing. In operation, the processing chamber 100 may afford real-time control of plasma conditions in the processing volume 120, such as via a controller 101 which may be contained within a processor 107. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the second electrode 124 in some embodiments.

Upon energizing a plasma in the processing volume 120, a potential difference may be established between the plasma and the first electrode 122. The electronic controller 140 may then be used to adjust the flow properties of the ground paths represented by the tuning circuit 136. A set point may be delivered to the tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Tuning circuit 136 may have a variable impedance that may be adjusted using the electronic controller 140. Where the electronic controller 140 is a variable capacitor, the capacitance range of each of the variable capacitors, may be chosen to provide an impedance range. This range may depend on the frequency and voltage characteristics of the plasma, which may have a minimum in the capacitance range of each variable capacitor. Hence, when the capacitance of the electronic controller 140 is at a minimum or maximum, impedance of the tuning circuit 136 may be high, resulting in a plasma shape that has a minimum aerial or lateral coverage over the substrate support. When the capacitance of the electronic controller 140 approaches a value that minimizes the impedance of the tuning circuit 136, the aerial coverage of the plasma may grow to a maximum, effectively covering the entire working area of the substrate support 104. As the capacitance of the electronic controller 140 deviates from the minimum impedance setting, the plasma shape may shrink from the chamber walls and aerial coverage of the substrate support may decline.

The electronic sensor 138 may be used to tune the tuning circuit 136 in a closed loop. A set point for current or voltage, depending on the type of sensor used, may be installed in each sensor, and the sensor may be provided with control software that determines an adjustment to the electronic controller 140 to minimize deviation from the set point. Consequently, a plasma shape may be selected and dynamically controlled during processing. It is to be understood that, while the foregoing discussion is based on electronic controller 140, which may be a variable capacitor, any electronic component with adjustable characteristic may be used to provide tuning circuit 136 with adjustable impedance.

Processing chamber 100 may be utilized in some embodiments of the present technology for processing methods that may include bottom-up deposition of materials for semiconductor structures. It is to be understood that the chamber described is not to be considered limiting, and any chamber that may be configured to perform operations as described may be similarly used.

Semiconductor processes performed on semiconductor substrates rely on the substrate being completely chucked to the pedestal during the semiconductor process. When fully chucked, the substrate is prevented from moving on the pedestal during the process. The substrate is also held flat against the pedestal, which may correct for bowing or warpage that may have previously been induced in the substrate. If the substrate is not fully chucked against the pedestal, the horizontal profile of the substrate may vary from the center to the edge of the substrate, thereby causing inconsistent results of the semiconductor process (e.g., varying film thicknesses, varying etch depths, varying fill heights, and so forth). Additionally, a substrate that is not fully chucked against the pedestal may result in a gap between the substrate and the pedestal, thereby allowing the backside of the substrate to possibly be affected by the semiconductor process. An un-chucked substrate may also move on the pedestal, resulting in scratches or other damage to the backside of the substrate.

Conversely, if the applied chucking voltage is too great, the force applied to the substrate may damage the substrate. For example, over-chucking the substrate may result in cracks or shattering of the substrate. More importantly, applying a chucking voltage that is too high may cause charge buildup on the electrodes of the electrostatic chuck in the pedestal. This charge buildup may result in current arcs that discharge into the substrate. These current arcs may cause significant damage to the substrate, which may cause the entire substrate to be discarded and reduce yield of the manufacturing process. Applying an optimal chucking voltage that adequately holds the substrate flat against the pedestal while not applying too much force that could damage the substrate or cause current arcs represents a technical problem affecting many processing chambers.

Since the conditions in each processing chamber and the characteristics of each substrate may vary greatly across any semiconductor process, the optimal chucking conditions may need to be determined for each individual processing chamber, semiconductor process, and/or semiconductor substrate. For example, the position of the substrate, the flatness of the substrate, the temperature of the process, the pedestal material, and/or other characteristics may affect the optimal chucking conditions.

The embodiments described herein solve these and other technical problems by using an adjustable current limit on an ESC power source to limit current arcs associated with the electrostatic chuck. The ESC power source may prevent the supplied current from exceeding the adjustable current limit, thereby preventing current arcs from discharging into the substrate.

Figure 2:
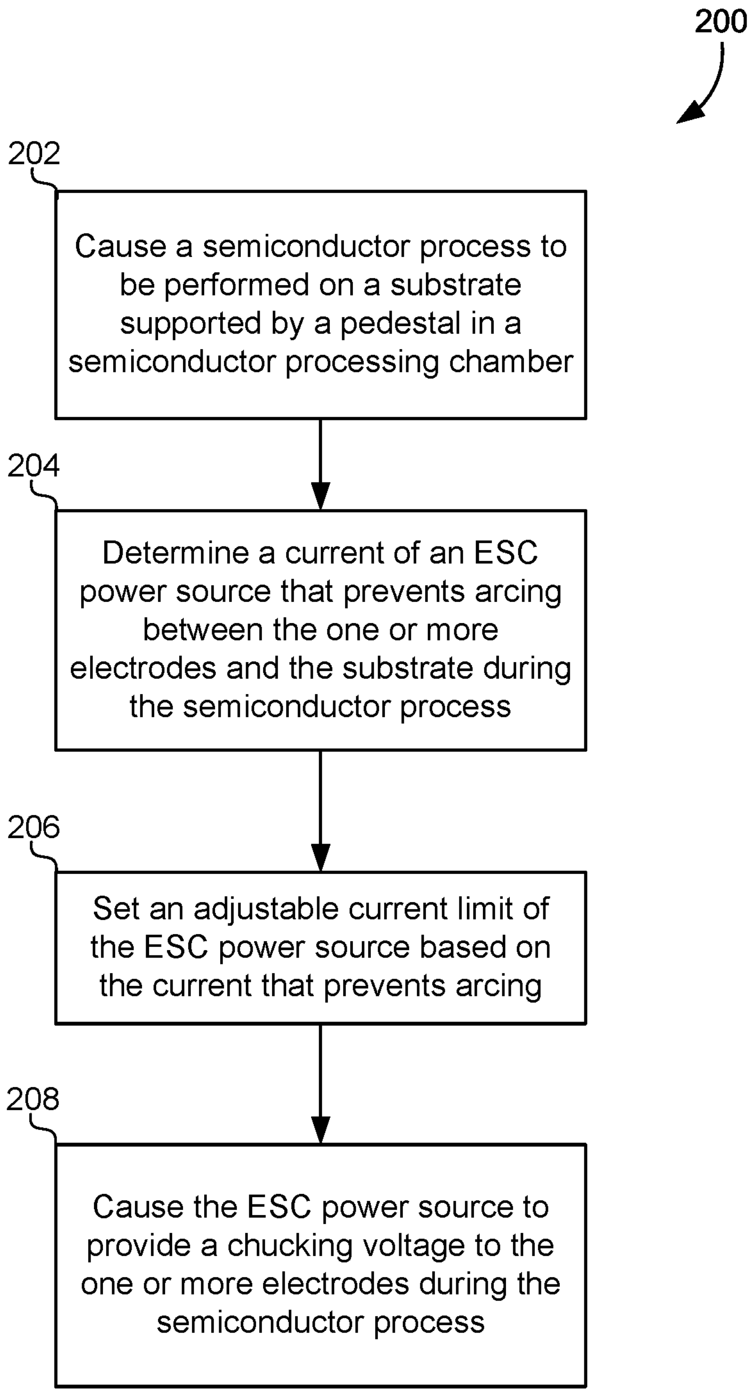
FIG. 2 shows a flow diagram of a process for preventing arcing in an electrostatic chuck, according to some embodiments.

FIG. 2 illustrates a flow diagram of a method 200 for preventing arcing in an electrostatic chuck, according to some embodiments. This method may be executed by a controller, such as the controller 101 illustrated in FIG. 1. The controller 101 may include one or more processors and one or more non-transitory computer-readable media that store instructions. These instructions may cause the one or more processors to perform the operations described in detail below. For example, the controller 101 may be implemented using a computer system, such as the computer system 600 described below in FIG. 6. The controller 101 may additionally be configured to control the operations of the processing chamber 100. For example, the controller 101 may cause different operating characteristics of the processing chamber to change during the semiconductor process based on a "recipe." Executing the recipe may allow the controller 101 to cause environmental and other conditions to change within the processing chamber. For example, the recipe may adjust temperatures, pressures, gas flows, gas species, chucking voltages, RF signals, plasma conditions, pedestal locations, and/or any other aspect of the processing chamber 100 as the semiconductor process is executed. The one or more processors may also be distributed between the controller 101 as an integrated controller of the processing chamber 100 and between other computer systems, such as a local server, a cloud-based server, a tool or platform controller, or any other computer system. The controller may also include one or more processors that are integrated in a power supply and configured to control a voltage output and/or current limit.

The method may include causing a semiconductor process to be performed on a substrate supported by a pedestal in a semiconductor processing chamber (202). The substrate may be a wafer or any other suitable substrate. For example, the substrate may include silicon substrates, glass substrates, and/or other materials. The substrate may also include features that have been formed in previous semiconductor processes, such as components for integrated circuits (e.g., transistors, resistors, capacitors, conductive traces, and so forth). The pedestal may include one or more electrodes of an electrostatic chuck (ESC) embedded in the pedestal. The electrodes may be formed from conductive material, such as copper wiring arranged in a wire mesh. The electrodes may also be formed in many different geometric patterns, including hemispheres, concentric circles, concentric rings, quadrants, sectors, and so forth.

The ESC may be coupled to an ESC power source, which provides a chucking voltage to the one or more electrodes. In some examples, the semiconductor process may involve a chemical vapor deposition process, such as a plasma-enhanced chemical vapor deposition (PECVD) process, or any other suitable semiconductor manufacturing process. The chucking voltage may be between about 200 V and about 300 V, between about 300 V and about 400 V, between about 400 V and about 500 V, between about 500 V and between about 600 V, between about 600 V and about 700 V, between about 700 V and about 800 V, between about 800 V and about 900 V, between about 900 V and about 1000 V, between about 1,000 volts and about 1,100 V, between about 1,100 V and about 1,200 V, and/or greater than about 1,200 V (e.g., up to around 2000 V). The chucking voltage may also be any specific value in the combination of ranges disclosed above (e.g., 550 V, 775 V, 825 V, 1560 V, 2000 V, and so forth). The chucking voltage may also be any range included in the combination of ranges disclosed above (e.g., between about 550 V and about 1710 V, etc.). These positive voltages (or equivalent negative voltages) may be used for monopolar ESC designs. Additionally, both positive and negative ranges described above may be used for bipolar ESC designs (e.g.,+/−2000 V). The range of chucking voltages applied to the ESC by the ESC power source may be sufficient to hold the substrate to the pedestal during the process. However, in some situations, the upper ranges of these chucking voltages may also be sufficient to cause DC current arcs within the semiconductor processing chamber.

In some embodiments, the method 200 may involve monitoring the current output of the ESC power source during the semiconductor process. For example, the ESC power source may include current monitoring circuitry that may monitor the current output of the ESC power source. In some examples, the ESC power source may be coupled to external current monitoring circuitry (e.g., an ammeter) that may monitor the current output of the ESC power source.

The method may also include determining a current of the ESC power source that prevents arcing between the one or more electrodes and the substrate during the semiconductor process (204). Specific details for determining the proper output of the ESC power source are described in detail below in relation to FIG. 4. For example, various outputs for the ESC power source (e.g., different voltage outputs) may be applied to a substrate, such as a test substrate. The conditions within the semiconductor processing chamber may be monitored in order to detect possible current arcs occurring within the chamber. For example, the output voltage of the ESC power source may be set at the specific output called for in the recipe. The output current of the ESC power source may be monitored during the test run. If no arcs occur, the monitored current output may be used as a basis for the adjustable current limit on the ESC power source. For example, the adjustable limit may be set to be a predetermined amount above the current output (e.g., the measured current plus 5%, 10%, 15%, 20%, 25%, etc.). This ensures that the current output from the normal operation of the ESC is not hampered by the adjustable current limit, while also allowing the current limit to stop current arcs that rapidly rise above the normal current level.

In other embodiments, parameters of the process may be changed until a current arc is induced during a test run. For example, the temperature in the chamber may be increased, the voltage output of the ESC power source may be increased, different-sized substrates may be used, the location of the substrate may be altered, and so forth. As described above, the current output of the ESC power source may be monitored when the current arc occurs. The current limit of the ESC power source may then be set to be a predetermined amount below the measured arc current (e.g., the calculated arc current minus 5%, 10%, 15%, 20%, 25%, etc.).

Alternatively, a physics-based model may be used to determine the current at which an arc will occur based on the design parameters of the process and the semiconductor chamber itself. For example, the current arcs generally occur through a low-resistance path between the ESC electrode in the pedestal and the substrate, the plasma, and/or other portions of the processing chamber. The total resistance of the current path through the pedestal material may be calculated and used in conjunction with the output voltage of the ESC power source to determine the arc current. For example, the material of the pedestal (e.g., aluminum nitride) may have a known resistance that varies with temperature. The distance between the electrode and the edge of the pedestal may also be a known design parameter (e.g., between about 1-10 mm). These values may be used to calculate the arc current at various temperatures dictated by the recipe. For example, at a given temperature, the resistivity of the pedestal material may be multiplied by the distance through which the current arc will travel and divided by a cross-sectional area. This total resistance value may be used with the voltage applied by the ESC power source to calculate the current using conventional equations. The current limit of the ESC power source may then be set to be a predetermined amount below the calculated arc current (e.g., the calculated arc current minus 5%, 10%, 15%, 20%, 25%, etc.).

The method may also include setting an adjustable current limit of the ESC power source based on the current that prevents arcing (206). In some embodiments, the ESC power source may receive a signal from the controller that may cause the ESC power source to set the adjustable current limit based on the current that prevents arcing. In some embodiments, the adjustable current limit may be an integrated function of the ESC power source. That is, the ESC power source may include circuitry that may implement the adjustable current limit. In some embodiments, an operator of the ESC power source may provide the adjustable current limit as a manual input.

The adjustable current limit may be set based on certain characteristics of the semiconductor process, such as a temperature at which the semiconductor process is performed or a resistivity of the pedestal. In some embodiments, the ESC power source may determine the adjustable current limit automatically based, for example, on sensor data retrieved from the semiconductor process chamber or expected process conditions in the semiconductor process chamber. For example, the arc current may vary with temperature based on the change in resistivity of the pedestal material as described above. Therefore, each different temperature setting in a recipe may include a different current at which arcing will occur. As the temperature in the processing chamber cycles between different recipe setpoints, the adjustable current limit of the ESC power source may be changed dynamically during the process. The controller may use the setpoint temperature of the recipe and/or a measured temperature from a temperature sensor in the semiconductor processing chamber. Other conditions or characteristics of the processing chamber and/or process may also be used. For example, the voltage output of the ESC power source may change during the process, and each voltage setting may be used to determine a new set point for the adjustable current limit.

The method may also include causing the ESC power source to provide a chucking voltage to the one or more electrodes during the semiconductor process (208). In some examples, the chucking voltage may be manually input by an operator of the ESC power source. In some examples, the chucking voltage may be determined and set by the ESC power source. For example, the controller may provide a signal to the ESC power source to adjust the chucking voltage as determined by a recipe for the process. In some embodiments, the ESC power source may gradually increase the chucking voltage until the chucking voltage reaches a desired value. Additionally, the chucking voltage of the ESC power source may change to different levels during the process according to the process recipe.

In some embodiments, the semiconductor process may be performed on a test substrate prior to performing the semiconductor process on the substrate. For example, the ESC power source, controller, or operator associated with the ESC power source can monitor the current output of the ESC power source during the semiconductor process. Monitoring the current output of the ESC power source may involve logging the current output via a data logging module and/or software. Once the semiconductor process has completed, it may be determined that no arcing occurred during the semiconductor process as described above. Alternatively, the ESC power source may receive an indication from the controller that no arcing occurred during the semiconductor process.

It should be appreciated that the specific steps illustrated in FIG. 2 provide particular methods for preventing arcing in the electrostatic chuck according to various embodiments. Other sequences of steps may also be performed according to alternative embodiments. For example, alternative embodiments may perform the steps outlined above in a different order. Moreover, the individual steps illustrated in FIG. 2 may include multiple sub-steps that may be performed in various sequences as appropriate to the individual step. Furthermore, additional steps may be added or removed depending on the particular applications. Many variations, modifications, and alternatives also fall within the scope of this disclosure.

Figure 3:
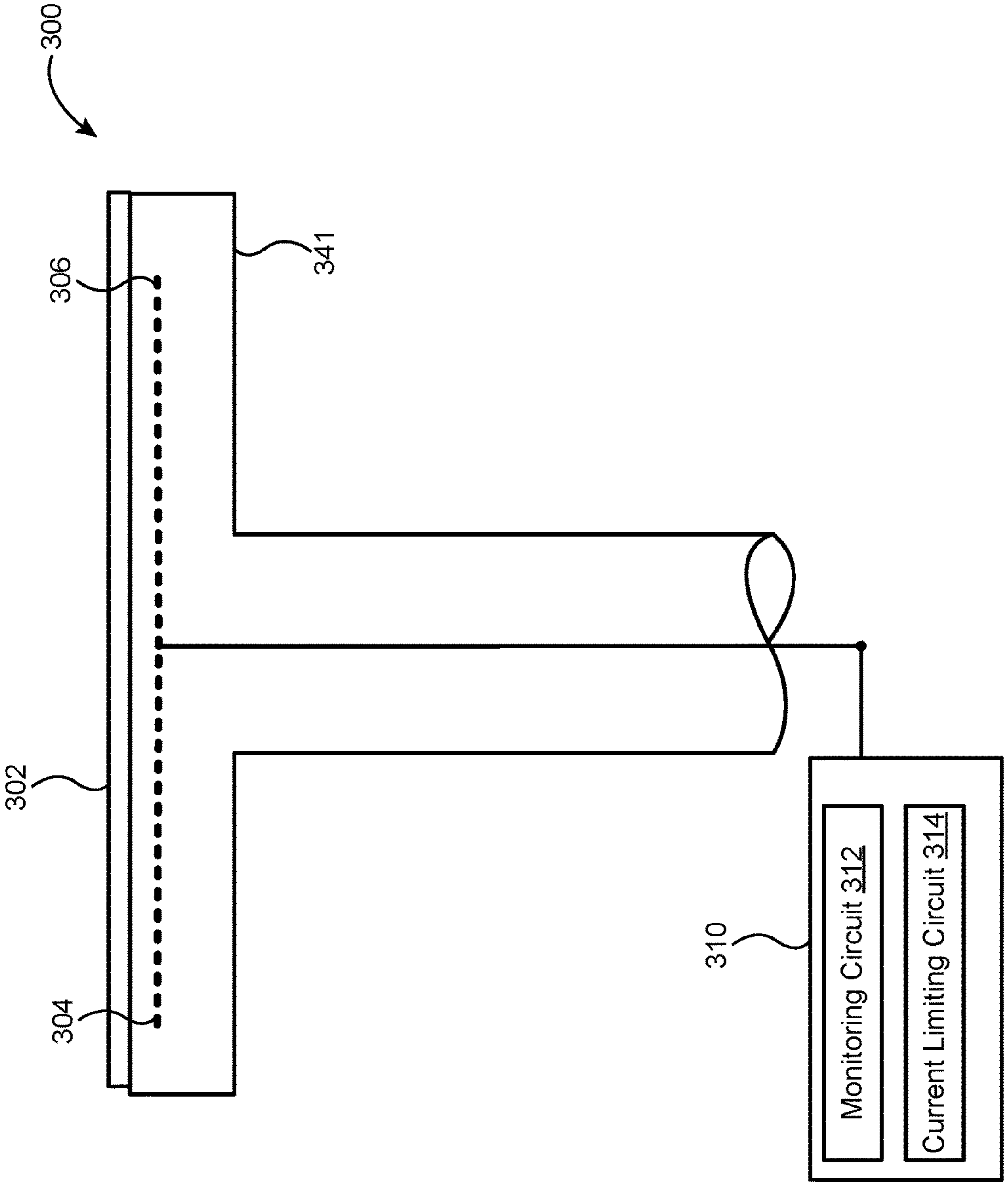
FIG. 3 shows a schematic cross-sectional view of a processing chamber having an apparatus that may prevent arcing in an electrostatic chuck during a semiconductor process, according to some embodiments.

FIG. 3 shows a schematic cross-sectional view of a processing chamber 300 having an apparatus that may prevent arcing in an electrostatic chuck (ESC) during a semiconductor process according to some embodiments. The processing chamber 300 may be the same as or different from the processing chamber 100 depicted in FIG. 1 and may include similar components. For example, the processing chamber 300 may include pedestal 341 having an electrostatic chuck (ESC) for applying a chucking voltage to the substrate 302. Generally, the pedestal 341 may include one or more electrodes. For a bipolar chuck, this may include two electrodes embedded in the pedestal 341, such as a first electrode 304 and a second electrode 306. The electrodes may be implemented with any type of conductive material, such as a wire mesh. The electrodes may be embedded at a distance within the pedestal 341 that may be used to calculate a resistance of a current path for an arc current as described above. When opposing chucking voltages are applied to these electrodes, an electrostatic force may be generated that may attract the substrate 302 to the surface of the pedestal 341.

The pedestal 341 may be coupled to an ESC power source 310. The ESC power source may provide the chucking voltage to the one or more electrodes embedded in the pedestal 341. In some examples, the ESC power source 310 may include or may be communicatively coupled to a controller (e.g., the controller 110 shown in FIG. 1.) The ESC power source 310 may include a monitoring circuit 312 that may monitor a current output by the ESC power source 310. Alternatively, current output may be logged and analyzed to detect a current arc. For example, a rapid increase in the current output without a corresponding change in the output voltage may indicate a current arc. Alternatively, the current output may be compared to a threshold by the controller to determine whether a current arc occurred. The monitoring circuit 312 may be able to detect a current arcing event. In some examples, the monitoring circuit 312 may include an ammeter circuit, a circuit that detects a rate of change in the current, or any other suitable current monitoring circuit.

The ESC power source 310 may include a current limiting circuit 314. The current limiting circuit 314 may prevent a current from the ESC power source 310 from exceeding an adjustable current limit that is associated with the ESC power source 310. In some embodiments, the adjustable current limit may be input by a user. In some embodiments, the adjustable current limit may be determined and/or set by a controller or by any other suitable computing device that is coupled to and/or housed within the ESC power source 310.

The adjustable current limit may be set prior to initiating the semiconductor process and/or adjusted during the semiconductor process. The adjustable current limit may be set based on certain characteristics of the semiconductor process as described above. For example, the adjustable current may be set based on an expected process temperature, pressure, or any other suitable parameter or combination of parameters related to the semiconductor process. In some embodiments, the ESC power source 310 and/or the controller may receive data from one or more sensors that may monitor conditions in the processing chamber 300. Based on the data, the ESC power source 310 may adjust the adjustable current limit. In some embodiments, adjusting the adjustable current limit may involve adjusting a voltage associated with the current limiting circuit 314.

Existing ESC power sources may include a current limiting circuit that is static, and which is not dynamically adjustable in real-time during a semiconductor process. For example, the current-limiting circuits in existing supplies may use a fuse, static resistance, or other static threshold for detecting an over-current event. The embodiments described herein may use a new ESC power source that includes an adjustable limit that may be manually adjusted or programmatically adjusted by a controller. Examples of adjustable current living circuits are described below in FIG. 5.

Existing ESC power sources may also have a relatively long response time, such as above about 100-200 μs. This may be longer than a current arc present in the processing chamber. Therefore, the current limiting circuit 314 in these embodiments may be modified to have a relatively short response time. For example, the response time of the current limiting circuit 314 may be less than or about 50 μs, less than or about 40 μs, less than or about 30 μs, less than or about 20 μs, less than or about 10 μs, and/or less than or about 5 μs. The response time of the current limiting circuit 314 may also include a response time range between any of the values stated above (e.g., between about 10 μs and about 20 μs) and/or may include any specific value in these ranges (e.g., about 50 μs).

In some embodiments, the adjustable current limit may be set based on a previous iteration of the semiconductor process that may have resulted in a current arc. For example, the adjustable current limit may be set by experimentally determining, using a test substrate, a current value for the ESC power source 310 that caused arcing on the test substrate.

Figure 4:
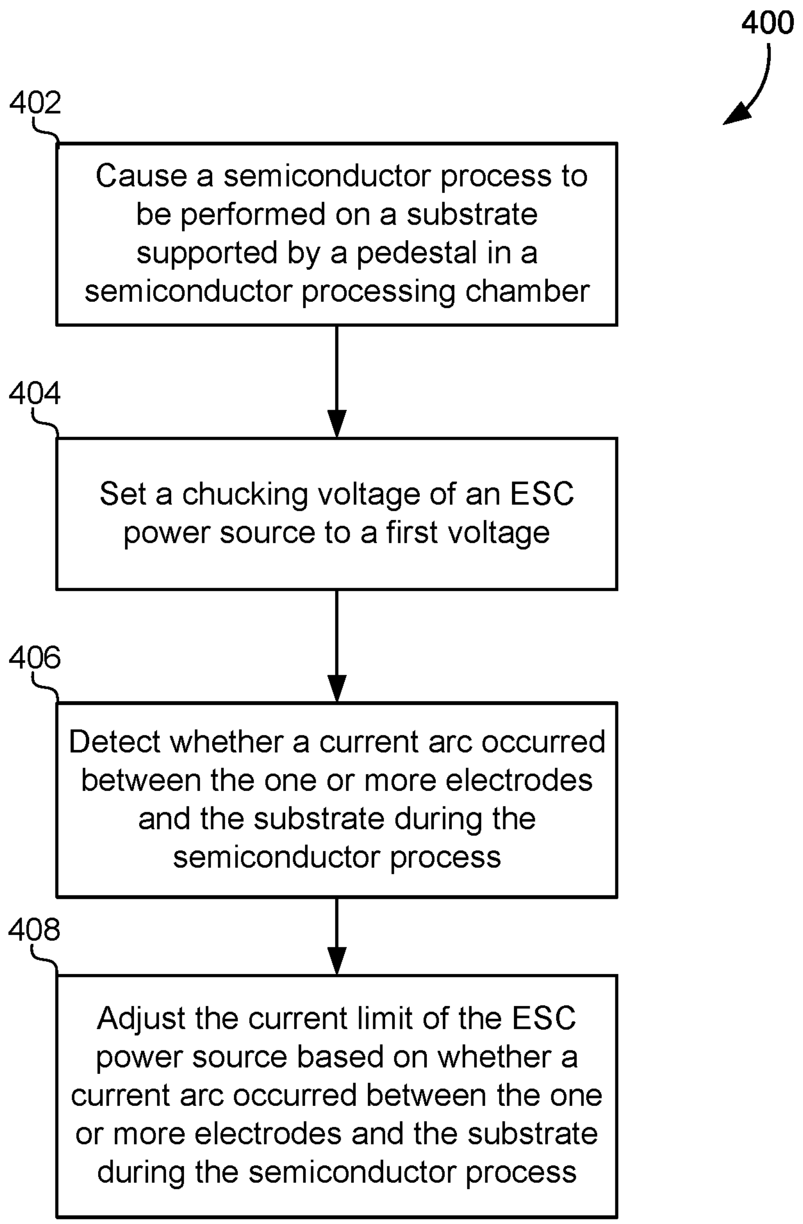
FIG. 4 shows a flow diagram of an iterative process for preventing arcing in an electrostatic chuck, according to some embodiments.

FIG. 4 illustrates a flow diagram of an iterative method 400 for preventing arcing in an electrostatic chuck according to some embodiments. This method may be executed by a controller as described above for the method 200 of FIG. 2. The method 400 may include causing a semiconductor process to be performed on a substrate supported by a pedestal in a semiconductor processing chamber. The pedestal may include one or more electrodes of an electrostatic chuck (ESC) embedded in the pedestal. The semiconductor process may be a semiconductor fabrication process, such as a plasma-enhanced chemical vapor deposition (PECVD) process, or any other suitable semiconductor process. In some examples, the substrate may be a test substrate, such as a test wafer, that may be used to determine which current values, chucking voltages, and/or semiconductor processing chamber characteristics may cause arcing.

The method 400 involve setting a chucking voltage of an ESC power source to a first voltage. In some examples, the ESC power source may receive a command to set the chucking voltage to the first voltage in response to the semiconductor process being initiated. For example, the controller may transmit a command to the ESC power source causing the ESC power source to adjust the chucking voltage to the first voltage. Additionally or alternatively, the ESC power source may receive manual input from an operator of the ESC power source for causing the ESC power source to adjust the chucking voltage to the first voltage. In some examples, the controller or operator of the ESC power source may cause the ESC power source to gradually adjust the chucking voltage until the chucking voltage has reached the first voltage. Some embodiments may calculate an estimated arc current as described above using the resistance and other physical characteristics of the process and/or processing station. This calculated arc current may be used to determine a starting point for the voltage output of the ESC power source for this iterative method.

The method 400 may also include detecting whether a current arc occurred between the one or more electrodes and the substrate during the semiconductor process. Detecting whether a current arc occurred may involve inspecting the substrate for damage. Alternatively, the ESC power source may determine that an arc has occurred based on one or more internal electrical measurements that may have been obtained during the semiconductor process, such as a power dissipation, a current, a rate of change of current, or any other suitable electrical measurements. In some embodiments, the ESC power source may receive an indication that a current arc has occurred from the controller. The controller may determine that arcing has occurred based on sensor data obtained from the semiconductor processing chamber during the semiconductor process.

The method 400 may also include adjusting the current limit of the ESC power source based on whether a current arc occurred between the electrodes and the substrate during the semiconductor process. In some embodiments, the current limit may be adjusted automatically by a controller. For example, in response to determining that an arc occurred the controller may provide the ESC power source with a signal that may cause the ESC power source to decrease the adjustable current limit to prevent arcing. Alternatively, in response to determining that an arc did not occur, the controller may provide the ESC power source with a signal that may cause the ESC power source to increase or maintain the adjustable current limit. The method 400 may be repeated iteratively in order to optimize the adjustable current limit.

Figure 5B:
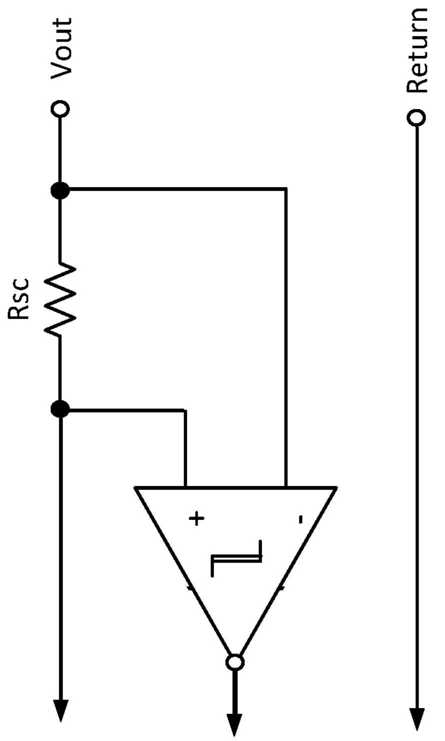
FIG. 5A and FIG. 5B show schematic diagrams of current limiting circuits that may be implemented to prevent arcing in an electrostatic chuck, according to some embodiments.
Figure 5A:
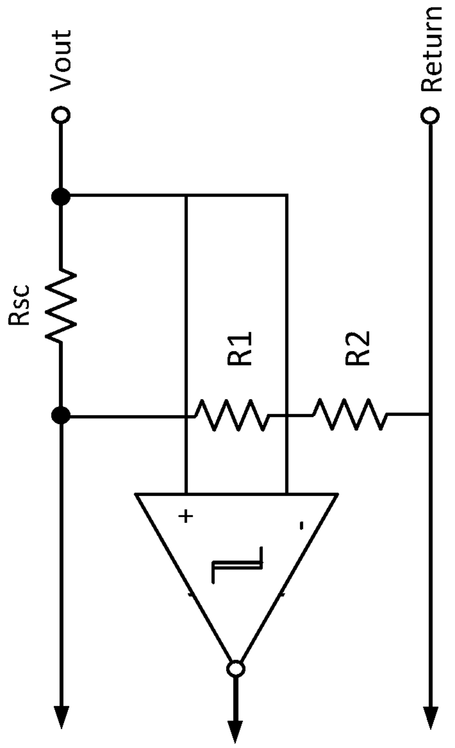

FIG. 5A and FIG. 5B show schematic diagrams of current limiting circuits that may be implemented to prevent arcing in an electrostatic chuck (ESC) according to some embodiments. Note that these circuits are provided only by way of example and are not meant to be limiting. Any other adjustable circuit may be used without limitation. In some examples, the circuits in FIG. 5A-B may be implemented to limit current through an ESC power source that may be electrically coupled to the ESC. In the examples shown, the DC current limit through the operational amplifiers (op-amps) is based on the impedance of the resistors in the circuit. While the examples shown in FIG. 5A and FIG. 5B make use of static resistors to limit current, the current limiting circuit(s) that may be used in the ESC power source may make use of potentiometers or other variable resistors to provide an adjustable current limit. Additionally, the current limiting circuits are not limited to the examples depicted in FIG. 5A and FIG. 5B and may include transistor-based limiter circuits or any other suitable current-limiting circuits.

Figure 6:
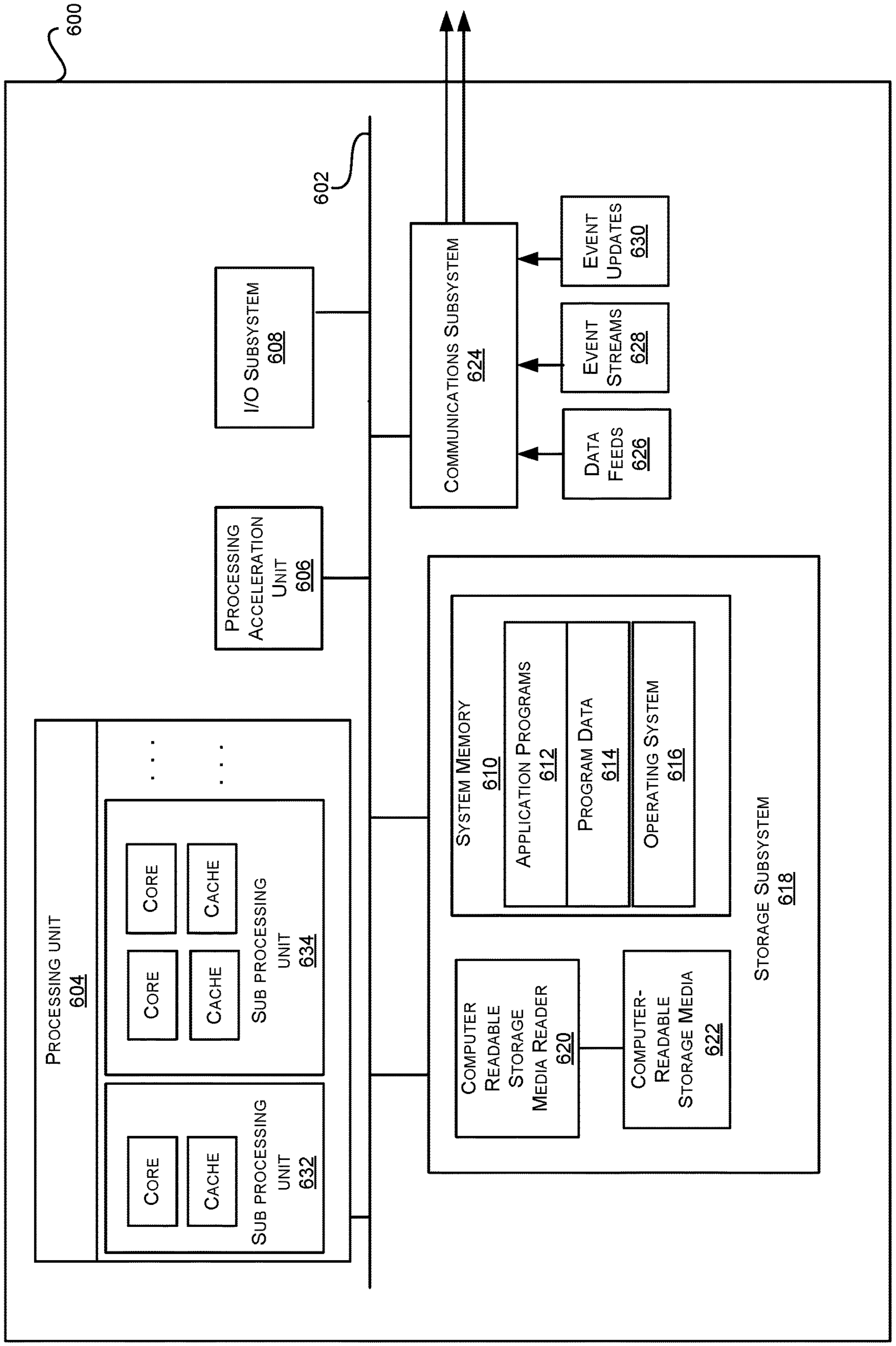
FIG. 6 illustrates an example computer system in which various embodiments may be implemented.

FIG. 6 illustrates an exemplary computer system 600, in which various embodiments may be implemented. The system 600 may be used to implement any of the computer systems or controllers described above. As shown in the figure, computer system 600 includes a processing unit 604 that communicates with a number of peripheral subsystems via a bus subsystem 602. These peripheral subsystems may include a processing acceleration unit 606, an I/O subsystem 608, a storage subsystem 618 and a communications subsystem 624. Storage subsystem 618 includes tangible computer-readable storage media 622 and a system memory 610.

Bus subsystem 602 provides a mechanism for letting the various components and subsystems of computer system 600 communicate with each other as intended. Although bus subsystem 602 is shown schematically as a single bus, alternative embodiments of the bus subsystem may utilize multiple buses. Bus subsystem 602 may be any of several types of bus structures including a memory bus or memory controller, a peripheral bus, and a local bus using any of a variety of bus architectures. For example, such architectures may include an Industry Standard Architecture (ISA) bus, EtherCAT, Micro Channel Architecture (MCA) bus, Enhanced ISA (EISA) bus, Video Electronics Standards Association (VESA) local bus, and Peripheral Component Interconnect (PCI) bus, which can be implemented as a Mezzanine bus manufactured to the IEEE P1386.1 standard.

Processing unit 604, which can be implemented as one or more integrated circuits (e.g., a conventional microprocessor or microcontroller), controls the operation of computer system 600. One or more processors may be included in processing unit 604. These processors may include single core or multicore processors. In certain embodiments, processing unit 604 may be implemented as one or more independent processing units 632 and/or 634 with single or multicore processors included in each processing unit. In other embodiments, processing unit 604 may also be implemented as a quad-core processing unit formed by integrating two dual-core processors into a single chip.

In various embodiments, processing unit 604 can execute a variety of programs in response to program code and can maintain multiple concurrently executing programs or processes. At any given time, some or all of the program code to be executed can be resident in processor(s) 604 and/or in storage subsystem 618. Through suitable programming, processor(s) 604 can provide various functionalities described above. Computer system 600 may additionally include a processing acceleration unit 606, which can include a digital signal processor (DSP), a special-purpose processor, and/or the like.

I/O subsystem 608 may include user interface input devices and user interface output devices. User interface input devices may include a keyboard, pointing devices such as a mouse or trackball, a touchpad or touch screen incorporated into a display, a scroll wheel, a click wheel, a dial, a button, a switch, a keypad, audio input devices with voice command recognition systems, microphones, and other types of input devices. Additionally, user interface input devices may include voice recognition sensing devices that enable users to interact with voice recognition systems through voice commands.

User interface output devices may include a display subsystem, indicator lights, or non-visual displays such as audio output devices, etc. The display subsystem may be a cathode ray tube (CRT), a flat-panel device, such as that using a liquid crystal display (LCD) or plasma display, a projection device, a touch screen, and the like. In general, use of the term "output device" is intended to include all possible types of devices and mechanisms for outputting information from computer system 600 to a user or other computer. For example, user interface output devices may include, without limitation, a variety of display devices that visually convey text, graphics and audio/video information such as monitors, printers, speakers, headphones, automotive navigation systems, plotters, voice output devices, and modems.

Computer system 600 may comprise a storage subsystem 618 that comprises software elements, shown as being currently located within a system memory 610. System memory 610 may store program instructions that are loadable and executable on processing unit 604, as well as data generated during the execution of these programs.

Depending on the configuration and type of computer system 600, system memory 610 may be volatile (such as random access memory (RAM)) and/or non-volatile (such as read-only memory (ROM), flash memory, etc.) The RAM typically contains data and/or program modules that are immediately accessible to and/or presently being operated and executed by processing unit 604. In some implementations, system memory 610 may include multiple different types of memory, such as static random access memory (SRAM) or dynamic random access memory (DRAM). In some implementations, a basic input/output system (BIOS), containing the basic routines that help to transfer information between elements within computer system 600, such as during start-up, may typically be stored in the ROM. By way of example, and not limitation, system memory 610 also illustrates application programs 612, which may include client applications, Web browsers, mid-tier applications, relational database management systems (RDBMS), etc., program data 614, and an operating system 616.

Storage subsystem 618 may also provide a tangible computer-readable storage medium for storing the basic programming and data constructs that provide the functionality of some embodiments. Software (programs, code modules, instructions) that when executed by a processor provide the functionality described above may be stored in storage subsystem 618. These software modules or instructions may be executed by processing unit 604. Storage subsystem 618 may also provide a repository for storing data used in accordance with some embodiments.

Storage subsystem 600 may also include a computer-readable storage media reader 620 that can further be connected to computer-readable storage media 622. Together and, optionally, in combination with system memory 610, computer-readable storage media 622 may comprehensively represent remote, local, fixed, and/or removable storage devices plus storage media for temporarily and/or more permanently containing, storing, transmitting, and retrieving computer-readable information.

Computer-readable storage media 622 containing code, or portions of code, can also include any appropriate media, including storage media and communication media, such as but not limited to, volatile and non-volatile, removable and non-removable media implemented in any method or technology for storage and/or transmission of information. This can include tangible computer-readable storage media such as RAM, ROM, electronically erasable programmable ROM (EEPROM), flash memory or other memory technology, CD-ROM, digital versatile disk (DVD), or other optical storage, magnetic cassettes, magnetic tape, magnetic disk storage or other magnetic storage devices, or other tangible computer readable media. This can also include nontangible computer-readable media, such as data signals, data transmissions, or any other medium which can be used to transmit the desired information and which can be accessed by computing system 600.

By way of example, computer-readable storage media 622 may include a hard disk drive that reads from or writes to non-removable, nonvolatile magnetic media, a magnetic disk drive that reads from or writes to a removable, nonvolatile magnetic disk, and an optical disk drive that reads from or writes to a removable, nonvolatile optical disk such as a CD ROM, DVD, or other optical media. Computer-readable storage media 622 may include, but is not limited to, flash memory cards, universal serial bus (USB) flash drives, secure digital (SD) cards, DVD disks, digital video tape, and the like. Computer-readable storage media 622 may also include, solid-state drives (SSD) based on non-volatile memory such as flash-memory based SSDs, enterprise flash drives, solid state ROM, and the like, SSDs based on volatile memory such as solid state RAM, dynamic RAM, static RAM, DRAM-based SSDs, magnetoresistive RAM (MRAM) SSDs, and hybrid SSDs that use a combination of DRAM and flash memory based SSDs. The disk drives and their associated computer-readable media may provide non-volatile storage of computer-readable instructions, data structures, program modules, and other data for computer system 600.

Communications subsystem 624 provides an interface to other computer systems and networks. Communications subsystem 624 serves as an interface for receiving data from and transmitting data to other systems from computer system 600. For example, communications subsystem 624 may enable computer system 600 to connect to one or more devices via the Internet. In some embodiments communications subsystem 624 can include radio frequency (RF) transceiver components for accessing wireless voice and/or data networks (e.g., using cellular telephone technology, advanced data network technology, such as 3G, 4G or EDGE (enhanced data rates for global evolution), WiFi (IEEE 802.11 family standards, or other mobile communication technologies, or any combination thereof), global positioning system (GPS) receiver components, and/or other components. In some embodiments communications subsystem 624 can provide wired network connectivity (e.g., Ethernet) in addition to or instead of a wireless interface.

In some embodiments, communications subsystem 624 may also receive input communication in the form of structured and/or unstructured data feeds 626, event streams 628, event updates 630, and the like on behalf of one or more users who may use computer system 600.

Additionally, communications subsystem 624 may also be configured to receive data in the form of continuous data streams, which may include event streams 628 of real-time events and/or event updates 630, that may be continuous or unbounded in nature with no explicit end. Examples of applications that generate continuous data may include, for example, sensor data applications, financial tickers, network performance measuring tools (e.g. network monitoring and traffic management applications), clickstream analysis tools, automobile traffic monitoring, and the like.

Communications subsystem 624 may also be configured to output the structured and/or unstructured data feeds 626, event streams 628, event updates 630, and the like to one or more databases that may be in communication with one or more streaming data source computers coupled to computer system 600.

Computer system 600 can be one of various types, including a handheld portable device (e.g., a smart phone, an computing tablet, a PDA), a wearable device (e.g., a smart watch), a PC, a workstation, a mainframe, a kiosk, a server rack, or any other data processing system.

Due to the ever-changing nature of computers and networks, the description of computer system 600 depicted in the figure is intended only as a specific example. Many other configurations having more or fewer components than the system depicted in the figure are possible. For example, customized hardware might also be used and/or particular elements might be implemented in hardware, firmware, software (including applets), or a combination. Further, connection to other computing devices, such as network input/output devices, may be employed. Based on the disclosure and teachings provided herein, other ways and/or methods to implement the various embodiments should be apparent.

As used herein, the terms "about" or "approximately" or "substantially" may be interpreted as being within a range that would be expected by one having ordinary skill in the art in light of the specification.

In the foregoing description, for the purposes of explanation, numerous specific details were set forth in order to provide a thorough understanding of various embodiments. It will be apparent, however, that some embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Specific details are given in the foregoing description to provide a thorough understanding of the embodiments. However, it will be understood that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to portable or fixed storage devices, optical storage devices, wireless channels and various other mediums capable of storing, containing, or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

In the foregoing specification, features are described with reference to specific embodiments thereof, but it should be recognized that not all embodiments are limited thereto. Various features and aspects of some embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

Additionally, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMS, EPROMs, EEPROMs, magnetic or optical cards, flash memory, or other types of machine-readable mediums suitable for storing electronic instructions. Alternatively, the methods may be performed by a combination of hardware and software.

What is claimed is:

1. A method of reducing current arcs in semiconductor processing chambers, the method comprising:

causing a semiconductor process to be performed on a substrate supported by a pedestal in a semiconductor processing chamber, wherein the pedestal comprises one or more electrodes of an electrostatic chuck (ESC) embedded in the pedestal;

determining a current of an ESC power source at which arcing does not occur from the one or more electrodes during the semiconductor process;

setting an adjustable current limit of a current limiting circuit integrated into the ESC power source based on the current at which arcing does not occur; and causing the ESC power source to provide a chucking voltage to the one or more electrodes during the semiconductor process, wherein the current limiting circuit prevents a current output of the ESC power source from exceeding the adjustable current limit.

2. The method of claim 1, further comprising:

detecting, by the ESC power source, a current output that exceeds the adjustable current limit; and preventing the current output from exceeding the adjustable current limit to prevent arcing between one or more electrodes in the substrate.

3. The method of claim 1, wherein the adjustable current limit of the ESC power source comprises a response time of less than 20 μs in response to a current arc.

4. The method of claim 1, wherein determining the current of the ESC power source at which arcing does not occur comprises:

receiving a distance of a minimum current path between the one or more electrodes and the substrate through the pedestal;

determining a resistance of the minimum current path through the pedestal; and determining the current limit based on the resistance of the minimum current path.

5. The method of claim 1, further comprising:

performing the semiconductor process on a test substrate;

monitoring the current output of the ESC power source during the semiconductor process;

determining that no arcing occurred during the semiconductor process; and using the current output as the adjustable current limit for subsequent substrates.

6. The method of claim 5, further comprising:

calculating a test current limit based on a resistance of a minimum current path between the one or more electrodes and the substrate through the pedestal; and using the test current limit while performing the semiconductor process on the test substrate.

7. The method of claim 1, wherein setting the adjustable current limit of the ESC power source comprises setting the adjustable current limit at or below the current of the ESC power source at which arcing does not occur.

* * * * *